US006549043B2

United States Patent
Roovers

(10) Patent No.: US 6,549,043 B2
(45) Date of Patent: Apr. 15, 2003

(54) SAMPLE AND HOLD CIRCUIT WITH COMPRESSION AND EXPANSION

(75) Inventor: Raf Lodewijk Jan Roovers, Eindhoven (NL)

(73) Assignee: Koninklijke Philips Electronics N.V., Eindhoven (NL)

(*) Notice: Subject to any disclaimer, the term of this patent is extended or adjusted under 35 U.S.C. 154(b) by 0 days.

(21) Appl. No.: 10/024,755

(22) Filed: Dec. 20, 2001

(65) Prior Publication Data

US 2002/0079934 A1 Jun. 27, 2002

(30) Foreign Application Priority Data

Dec. 22, 2000 (EP) .................................. 00204796

(51) Int. Cl.[7] .............................................. G11C 27/02
(52) U.S. Cl. ................................................. 327/94
(58) Field of Search .............................. 327/91, 93–96; 341/122, 124

(56) References Cited

U.S. PATENT DOCUMENTS

| | | | |
|---|---|---|---|
| 3,708,624 A | | 1/1973 | Boxall ................... 179/15 A |
| 4,528,549 A | | 7/1985 | Simpson ................ 340/347 |
| 5,343,089 A | * | 8/1994 | Itakura et al. .......... 327/407 |
| 5,659,497 A | * | 8/1997 | Ueno et al. ............. 327/95 |
| 5,736,879 A | * | 4/1998 | Pham .................... 327/102 |

FOREIGN PATENT DOCUMENTS

| | | | |
|---|---|---|---|
| DE | 4409063 C1 | 8/1995 | ............ H03M/1/12 |
| GB | 2210741 A | 6/1989 | ............ H03M/1/06 |
| WO | WO9940682 | 8/1999 | ............ H03M/1/12 |

* cited by examiner

Primary Examiner—My-Trang Nuton
(74) Attorney, Agent, or Firm—Aaron Waxler

(57) ABSTRACT

An electronic circuit comprising a sample and hold circuit (S/H) for sampling and temporarily holding an input data signal ($U_i$, $I_i$), comprising means (S; $T_S$) for the sampling of a data voltage ($U_1$) which corresponds to the input data signal ($U_i$, $I_i$), a capacitive element ($C_1$) for temporarily holding the sampled voltage ($U_C$), and means (CPR) for compressing the voltage range of the data voltage ($U_1$) which is to be sampled. The electronic circuit is further provided with expansion means (EXP) for converting the sampled voltage ($U_{C1}$) into a sampled output data signal ($I_0$) in a manner such that it corresponds linearly to the input data signal ($U_i$, $I_i$). This is achieved, for example, by using a first field effect transistor ($T_1$) for the compression means (CPR) and a second field effect transistor ($T_2$) for the expansion means (EXP). The gate-source voltage of the first field effect transistor ($T_1$) forms the data voltage ($U_1$) which is compressed since the drain-source current of the first field effect transistor ($T_1$) is linear with respect to the input data signal ($U_i$, $I_i$). The first ($T_1$) and second ($T_2$) field effect transistors in fact form a sample and hold current mirror. Thus, though the output current of the sample and hold current mirror is approximately linear with respect to the input current, the output current is a sampled version of the input current.

6 Claims, 3 Drawing Sheets

S/H

SAMPLE AND HOLD CIRCUIT WITH COMPRESSION AND EXPANSION

BACKGROUND OF THE INVENTION

The invention relates to an electronic circuit comprising a sample and hold circuit for sampling and holding an input data signal, comprising switching means for sampling a data voltage which corresponds to the input data signal and a capacitive element for temporarily holding the sampled voltage.

Such electronic circuits are known from the prior art and are used inter alia in various types of analog-to-digital converters. There is a general trend in the design of electronic circuits towards operation at low supply voltages. The minimum required supply voltage in known sample and hold circuits is equal to or higher than the maximum value of the sampled voltage which corresponds to a maximum voltage of the input data signal.

SUMMARY OF THE INVENTION

It is accordingly a problem f known sample and hold circuits that they do not function at supply voltages which are lower than the maximum voltage of the input data signal.

It is an object of the invention, therefore, to provide an electronic circuit with an improved sample and hold circuit which can operate at a lower supply voltage.

According to the invention, the electronic circuit mentioned in the opening paragraph is for this purpose characterized in that the electronic circuit comprises compression means for compressing the voltage range of the data voltage to be sampled.

The presence of the compression means reduces the maximum value of the sampled voltage across the capacitive element. As a result, the electronic circuit can operate at a lower supply voltage.

An embodiment of an electronic circuit according to the invention is characterized in that the electronic circuit further comprises expansion means for converting the sampled voltage into a sampled output data signal which corresponds approximately linearly to the input data signal.

The expansion means supply a current which is dependent approximately linearly on the input data signal. As a result, the output data signal is substantially undistorted, while nevertheless the electronic circuit can operate at a lower supply voltage.

An embodiment of an electronic circuit according to the invention is characterized in that the compression means comprise a first transistor with a main current path which is designed to pass a current which is substantially linearly dependent on the input data signal, a control voltage of the first transistor constituting the data voltage to be sampled in the operational state, and in that the expansion means comprise a second transistor such that the sampled voltage constitutes a control voltage for the second transistor in the operational state, while the second transistor comprises a main current path for supplying the sampled output data signal.

The first and the second transistor are mutually matched, so that they in fact form a current mirror, i.e. the output current of the current mirror is a sampled version of the input current of the current mirror. The first and the second transistor may be constructed as bipolar transistors or as field effect transistors.

BRIEF DESCRIPTION OF THE DRAWINGS

The invention will be explained in more detail with reference to the accompanying drawing, in which.

DETAILED DESCRIPTION OF THE INVENTION

Identical components or elements have been given the same reference symbols in these Figures.

Figure 1:
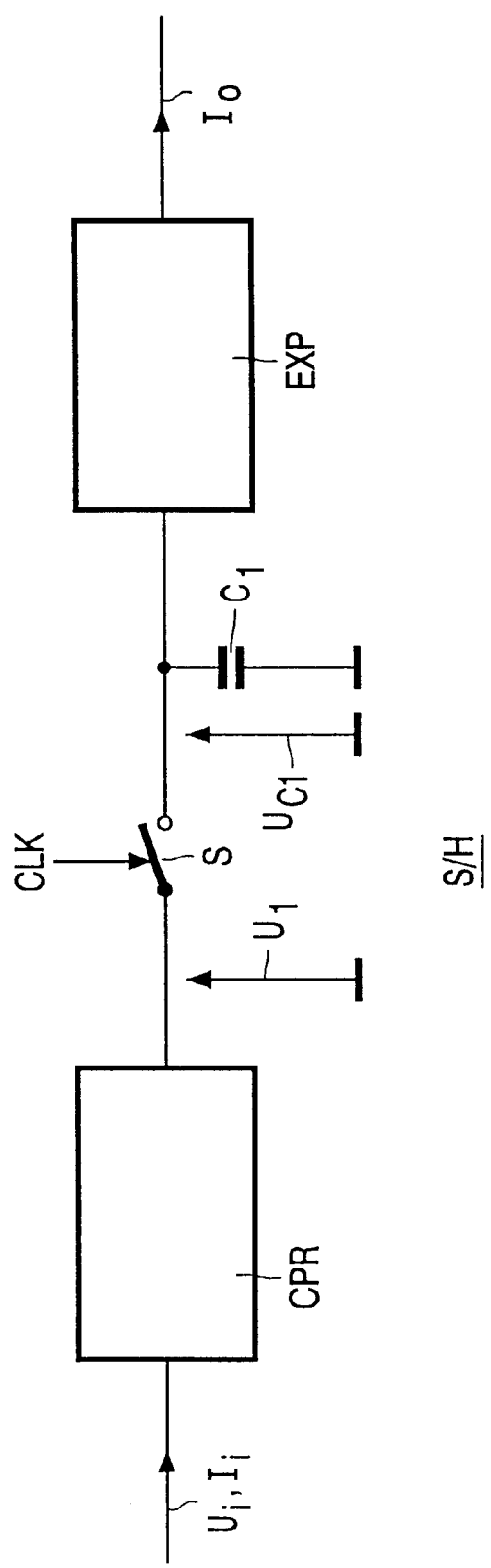
FIG. 1 is a diagram showing the operating principle of a sample and hold circuit according to the invention.

FIG. 1 is a diagram showing the principle of the sample and hold circuit according to the invention. The circuit comprises compression means CPR, switching means S under the control of a clock signal CLK, a capacitive element constructed with a capacitor $T_1$, and expansion means EXP. The compression means CPR receive an input data signal in the form of an input voltage $U_i$ or an input current $I_i$ and convert this input data signal into a compressed data voltage $U_1$. The data voltage $U_1$ is sampled by the switching means S such that a sampled voltage $U_{C1}$ arises which is held by the capacitor $C_1$. The sampled $U_{C1}$ is converted by the expansion means into an output data signal formed by the output current $I_0$.

Figure 2:
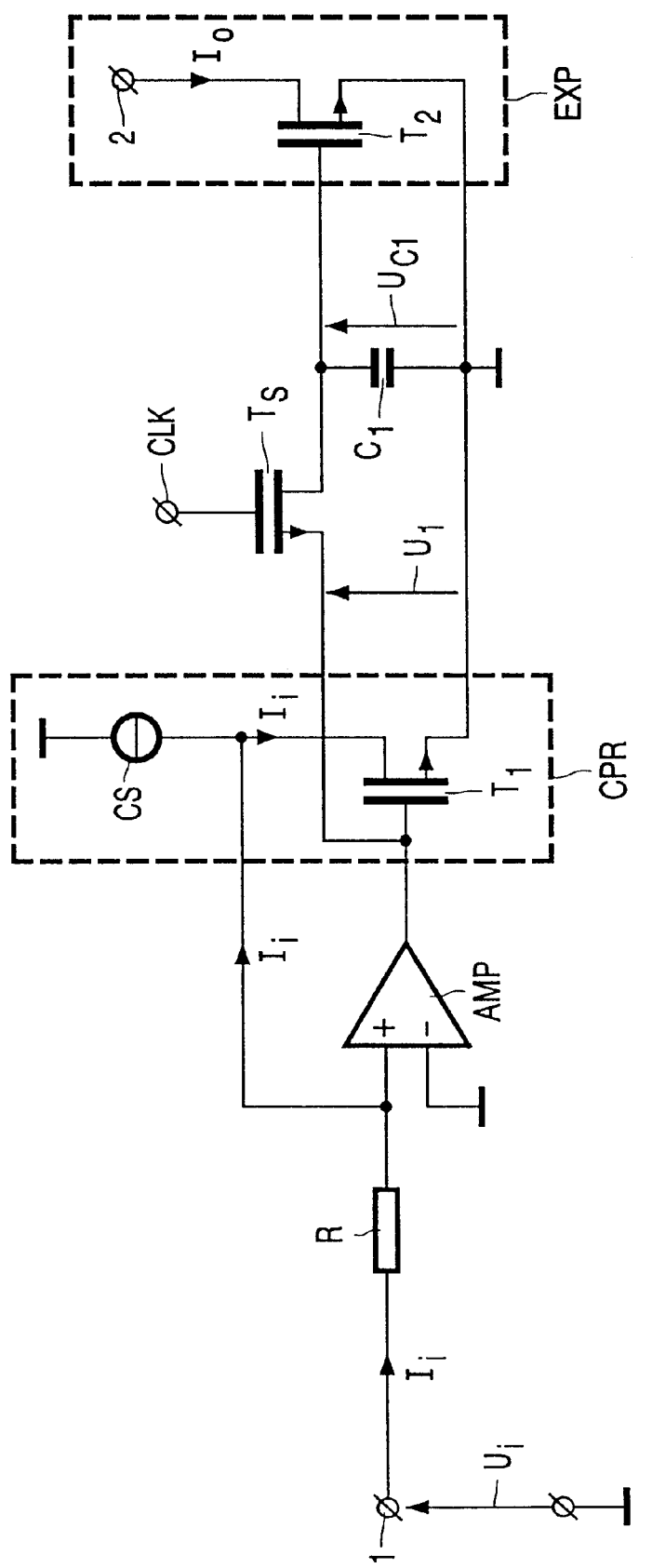
FIG. 2 shows an embodiment of a sample and hold circuit according to the invention.

FIG. 2 is a circuit diagram of an embodiment of a sample and hold circuit S/H according to the invention. The compression means CPR are constructed with a first field effect transistor $T_1$ and a current source CS for providing a DC current through the first field effect transistor $T_1$. The expansion means EXP constructed with a second field effect transistor $T_2$. The sample and hold circuit S/H further comprises an amplifier AMP with a non-inverting input, an inverting input, and an output, a resistor R, a field effect transistor $T_s$ which forms the switching means of FIG. 2, and the capacitor $C_1$. The resistor R is connected between an input terminal 1 and the non-inverting input of the amplifier AMP. The first field effect transistor $T_1$ is connected by a gate to the output of the amplifier AMP. The source of the transistor $T_1$ is connected to a reference voltage. The drain of the transistor $T_1$ is connected to the current source CS and to the non-inverting input of the amplifier AMP. A switching transistor, constructed with a field effect transistor $T_s$ in this example, is connected by a source to the gate of the first field effect transistor $T_1$ and by a drain to the gate of the second field effect transistor $T_2$. The gate of the transistor $T_s$ receives a clock signal so as to be able to sample the data voltage $U_1$ which is present between the gate and the source of the first field effect transistor $T_1$ and to supply the sampled voltage $U_{cl}$ to the capacitor $C_1$. The circuit operates as follows. The amplifier AMP and the field effect transistor $T_1$ form a negative feedback system, so that the non-inverting input of the amplifier AMP forms a so-called virtual ground. As a result, the input voltage $U_i$ is converted via the resistor R into an input current $I_i$ which flows through the drain-source path of the first transistor $T_1$. This generates a gate-source voltage between the gate and the source of the first transistor $T_1$ which constitutes the data voltage $U_1$. Owing to the characteristic of this field effect transistor $T_1$, the data voltage $U_1$ is a compressed version of the input voltage $U_i$. It is also possible, more directly, to have a data input current $I_i$ flow through the drain-source path of the first field effect transistor $T_1$. This may be achieved, for example, through the omission of the resistor R and the amplifier AMP and through a connection of both the gate and the drain of the first field effect transistor $T_1$ to the input terminal 1. The data voltage $U_1$ is sampled by means of the field effect transistor $T_s$, which acts as a switch, so that the sampled voltage is temporarily stored in the capacitor $C_1$. The second field effect transistor $T_2$ converts this sampled voltage $U_{C1}$ into an output current $I_0$. Since the first and the second field effect transistors $T_1$ and $T_2$ are mutually matched, the output current $I_0$ is linear with respect to the input current $I_i$, and accordingly also with respect to the input voltage $U_i$.

Figure 3:
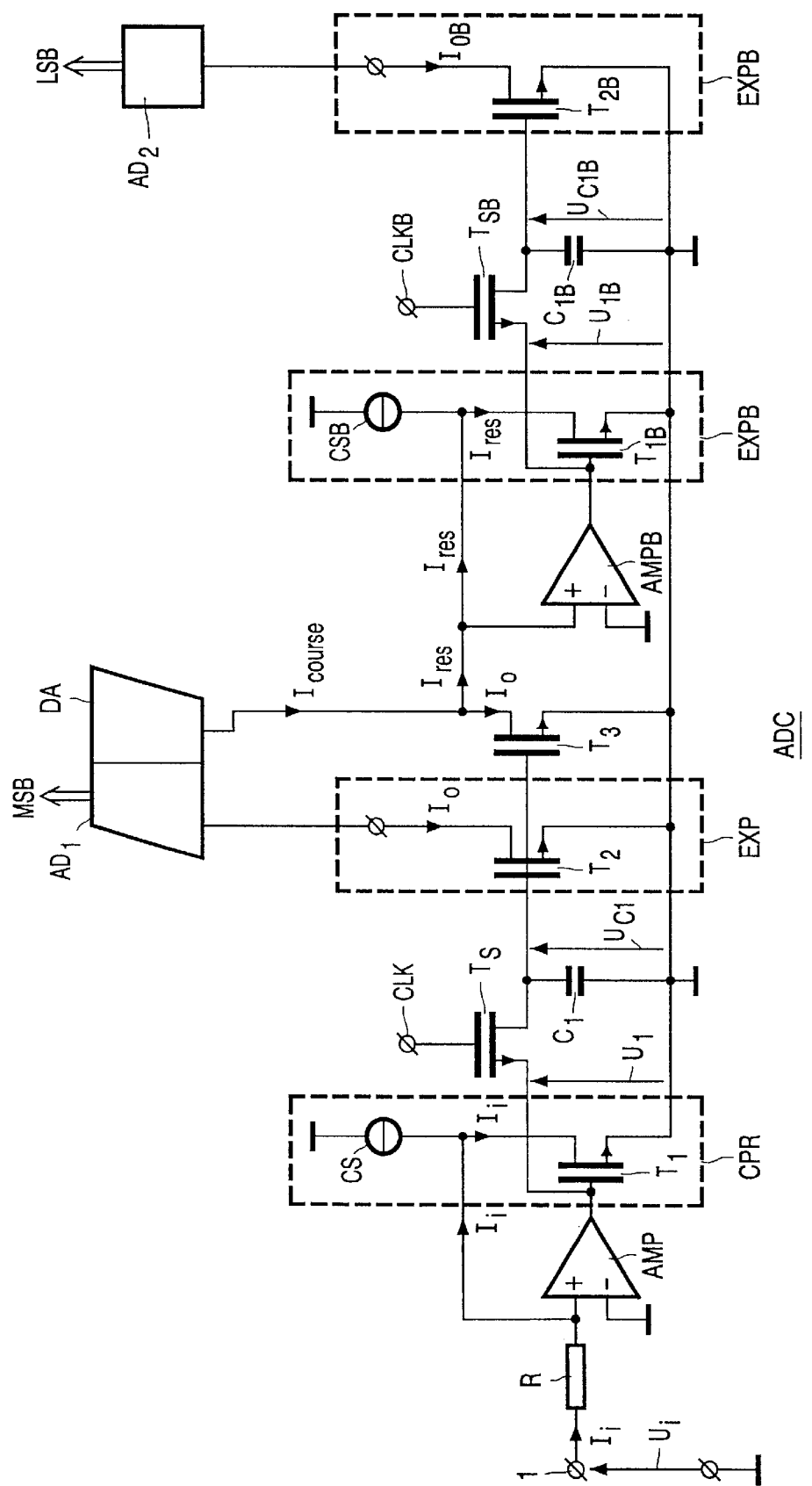
FIG. 3 shows an analog-to-digital converter which is provided with two sample and hold circuits according to the embodiment of FIG. 2.

FIG. 3 is a circuit diagram of an analog-to-digital converter ADC which comprises two sample and hold circuits in accordance with the principle of FIG. 2. The elements of the second sample and hold circuit have been given the same reference symbols, but with the addition of the letter B. The actual analog-to-digital converter is built up from a first part of the ADC for generating the most significant bits and a second part of the ADC for generating the less significant (remaining) bits. The first and the second part are usually denoted the coarse and the fine part, respectively. The ADC further comprises a field effect transistor $T_3$ which is connected by a gate to the gate of the second field effect transistor $T_2$ and by a source to the source of the second field effect transistor $T_2$. A same current $I_0$ flows in the drain-source path of the third transistor $T_3$ as in the drain-source path of the second transistor $T_2$. The current $I_0$ supplied by the second transistor $T_2$ is converted by the coarse analog-to-digital converter $AD_1$ into the most significant bits, which are denoted MSB. These bits MSB are supplied to a digital-to-analog converter DA for supplying a so-called coarse current $I_{coarse}$. The difference between the current $I_{coarse}$ and $I_0$ supplied by the transistor $T_3$ is denoted $I_{res}$. $I_{res}$ is the so-called residue and contains information on the LSB bits of the analog-to-digital converter ADC yet to be generated. The residue $I_{res}$ is supplied to the input of the second sample and hold circuit and is treated in the same manner as the input current $I_i$ in the first sample and hold circuit. The transistor $T_{2B}$, finally, supplies the current denoted $I_{OB}$, which is converted by the fine analog-to-digital converter $AD_2$ so as to deliver the least significant bits, which are denoted LSB. The bits MSB and LSB together form the complete digital word.

The electronic circuit may be implemented with discrete components or may be used as part of an integrated circuit. Field effect transistors may be replaced by bipolar transistors. It is also possible to replace all N-conductivity type transistors by P-conductivity type transistors.

What is claimed is:

1. A sample and hold circuit for sampling and holding an input data signal, comprising:

switching means for sampling a data voltage which corresponds to the input data signal, and a capacitive element for temporarily holding the sampled voltage;

compression means for compressing a voltage range of the data voltage to be sampled, wherein the compression means comprise a first transistor with a main current path that passes a current which is substantially linearly dependent on the input data signal, and wherein a control voltage of the first transistor constitutes the data voltage to be sampled in the operational state; and expansion means for converting the sampled voltage into a sampled output data signal that corresponds approximately linearly to the input data signal, wherein the expansion means comprise a second transistor such that the sampled voltage constitutes a control voltage for the second transistor in the operational state, while the second transistor comprises a main current path for supplying the sampled output data signal.

2. The sample and hold circuit of claim 1, wherein the switching means comprises a switching transistor driven by a clock signal.

3. A two-stage analog-to-digital converter (ADC), comprising:

a first stage that calculates a most significant bit and a second stage that calculates a least significant bit;

wherein both the first and second stages include:
a compression circuit for receiving and compressing an input data signal;
a switch for sampling and holding the compressed input data signal to generate a sampled data voltage; and
an expansion circuit for converting the sampled data voltage into a sampled output data signal that corresponds approximately linearly to the input data signal.

4. The two-stage ADC of claim 3, wherein each compression circuit includes a first transistor with a main current path that passes a current which is substantially linearly dependent on the input data signal, and wherein a control voltage of the first transistor constitutes a data voltage to be sampled in an operational state.

5. The two-stage ADC of claim 4, wherein each expansion circuit includes a second transistor such that the sampled data voltage constitutes a control voltage for the second transistor in the operational state, and the second transistor comprises a main current path for supplying the sampled output data signal.

6. The two-stage ADC of claim 5, wherein the first and second stage are coupled together with a connecting transistor that passes a residue that contains least significant bit information from the first stage to the second stage.

* * * * *